(12) United States Patent
Han et al.

(10) Patent No.: US 9,077,296 B2
(45) Date of Patent: Jul. 7, 2015

(54) SPLIT BIASED RADIO FREQUENCY POWER AMPLIFIER WITH ENHANCED LINEARITY

(71) Applicant: TriQuint Semiconductor, Inc., Hillsboro, OR (US)

(72) Inventors: Hailin Han, Oak Ridge, NC (US); Ezio Perrone, Munich (DE)

(73) Assignee: TriQuint Semiconductor, Inc., Hillsboro, OR (US)

( * ) Notice: Subject to any disclaimer, the term of this patent is extended or adjusted under 35 U.S.C. 154(b) by 52 days.

(21) Appl. No.: 13/959,398

(22) Filed: Aug. 5, 2013

(65) Prior Publication Data
US 2015/0035601 A1 Feb. 5, 2015

(51) Int. Cl.
*H03F 3/24* (2006.01)
*H03F 3/193* (2006.01)

(52) U.S. Cl.
CPC .............. *H03F 3/245* (2013.01); *H03F 3/193* (2013.01); *H03F 2203/21131* (2013.01)

(58) Field of Classification Search
CPC ............. H03F 2203/21127; H03F 2203/21131
USPC ................... 330/285, 290, 295, 296
See application file for complete search history.

(56) References Cited

U.S. PATENT DOCUMENTS 7,157,966 B2 * 1/2007 Baree et al. .................... 330/133
2005/0270103 A1 * 12/2005 Constantin .................... 330/285

OTHER PUBLICATIONS

Sandra and Smith: Microelectronic Circuit; 4th edition; New York: Oxford University press; pp. 515-516; 1998.
A.G. Metzger, et al.: An InGap/GaAs Merged HBT-FET (BiFET) Technology and Applications to the Design of Handset Power Amplifiers; IEEE J. Solid-state Circuits; vol. 42; No. 10; pp. 2137-2148; Oct. 2007.

* cited by examiner

*Primary Examiner* — Steven J Mottola
(74) *Attorney, Agent, or Firm* — Withrow & Terranova, P.L.L.C.

(57) ABSTRACT

A radio frequency (RF) power amplifier (PA) may include a first transistor and a second transistor. A first power cell may be coupled with the first transistor, and a second power cell may be coupled with the second transistor. In embodiments, the first transistor may be scaled to operate at a first current density, while the second transistor may be scaled to operate at a second current density.

19 Claims, 9 Drawing Sheets

US 9,077,296 B2

SPLIT BIASED RADIO FREQUENCY POWER AMPLIFIER WITH ENHANCED LINEARITY

FIELD

Embodiments of the present disclosure generally relate to the field of radio frequency (RF) power amplifiers (PAs).

BACKGROUND

For RF PAs used in wireless communication, linearity may be very important. Generally, linearity may be a measure of how linear the RF signal output of an RF PA is as the RF input signal is increased. In other words, linearity may refer to the gain (sometimes referred to as AM-AM distortion wherein AM may refer to amplitude modulation) and phase shift (sometimes referred to as AM-PM distortion wherein PM may refer to phase modulation) of the RF PA, and it may be desirable for the gain and phase to be consistent over a range of RF signal inputs or outputs such that the gain and phase of the RF PA at one signal input is approximately the same as the gain and phase of the RF PA at another signal input. One of the key measurements of the RF PA linearity may be the ACPR (Adjacent Channel Power Ratio), which may be the measure of the ratio between the total adjacent channel power (sometimes referred to as an intermodulation signal) to the main channel's power (sometimes referred to as a useful signal).

Existing RF PAs may include a bias circuit designed to bias the power amplifier to improve linearity. The bias circuit may use a bipolar transistor, such as heterojunction bipolar transistor (HBT), a field effect transistor such as a metal-oxide-semiconductor field effect transistor (MOSFET), a metal-semiconductor field effect transistor (MESFET), a pseudomorphic high-electron mobility transistor (PHEMT), or a combination of the above such as a bipolar field effect transistor (BiFET) and/or a bipolar high-electron-mobility transistor (BiHEMT). However, regardless of the bias circuit, existing RF PAs may still exhibit non-linear distortion in the output signal of the RF PA as the RF input signal of the RF PA increases.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure provide techniques and configurations of an RF PA with increased RF signal linearity. In embodiments, a first transistor may be coupled with a first power cell, and a second transistor may be coupled with a second power cell. The first transistor and the second transistor may be scaled such that the second transistor may be much larger than the first transistor. Similarly, the first power cell and second power cell may be scaled such that the second power cell is much larger than the first power cell. By configuring the RF PA in this manner, the output of the second power cell may be bias boosted such that the gain and phase of the RF PA exhibits an increased linearity response.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Figure 1:
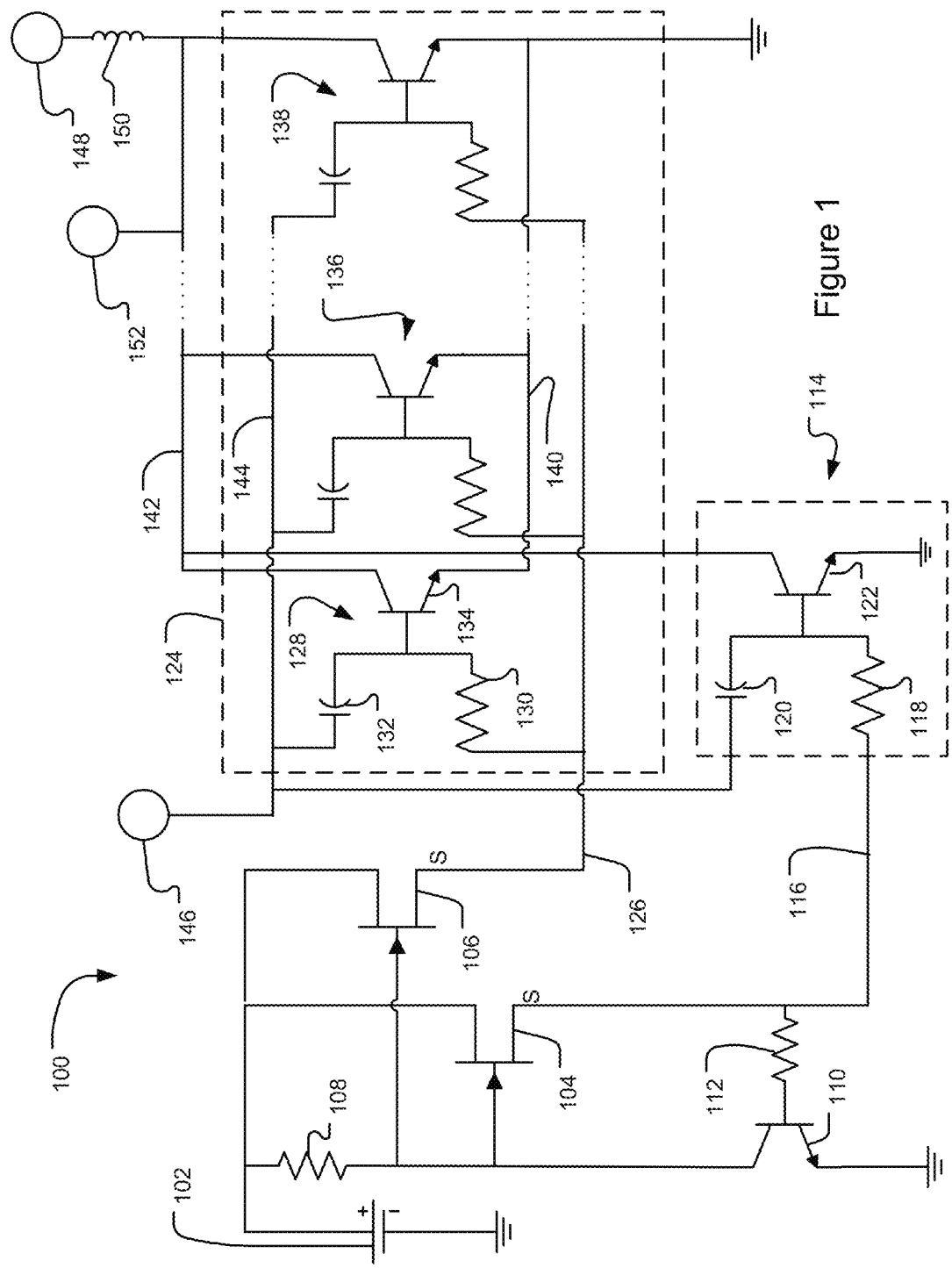
FIG. 1 schematically illustrates a circuit diagram of an RF PA, according to various embodiments.

As noted above, an RF PA may include one or more HBTs, BiFETs, BiHEMTs, MOSFETs, MESFETs, or PHEMTs. However, the RF PA may exhibit non-linear characteristics. FIG. 1 depicts an RF PA 100 that may exhibit increased linearity characteristics. In embodiments, the RF PA 100 may be coupled with a power source 102 such as a battery or some other power source that may provide a fixed reference voltage ($V_{DD}$) within the RF PA 100. The RF PA 100 may include a first transistor 104 and a second transistor 106. As shown in FIG. 1, the gates of the first transistor 104 and second transistor 106 may be coupled with one another. In embodiments, the first transistor 104 and/or the second transistor 106 may be MESFETs. Both the first transistor 104 and the second transistor 106 may have a source terminal (designated in FIG. 1 with the letter "S") and a drain terminal. As shown in FIG. 1, the drain terminals of the first transistor 104 and the second transistor 106 may be coupled with one another. The gates of the first transistor 104 and the second transistor 106 may be coupled with the power source 102 through a reference resistor 108. The source terminal of the first transistor 104 may be coupled with the base terminal of a bipolar transistor 110 via a feedback resistor 112. Similarly, the gate terminals of the first and second transistors 104 and 106 may be coupled with the collector terminal of the bipolar transistor. In some embodiments, the bipolar transistor 110 may be a heterojunction bipolar transistor. In some embodiments, the bipolar transistor 110 may be a BiFET or BiHEMT transistor, as shown. In other embodiments, not shown in FIG. 1, the bipolar transistor 110 may not be bipolar, but instead may be a MOSFET, MESFET, or PHEMT transistor. The emitter terminal of the bipolar transistor 110 may be coupled with ground, as shown in FIG. 1.

In embodiments, the source terminal of the first transistor 104 may be coupled with a first power cell 114 via a first line 116. The first power cell 114 may be indicated by the dashed line, as shown in FIG. 1. In embodiments, the first power cell 114 may include a first power cell structure including a first resistor 118 and a first capacitor 120 coupled with the base terminal of a first bipolar transistor 122, as shown in FIG. 1. In some embodiments, the first bipolar transistor 122 may be a heterojunction bipolar transistor. In some embodiments, the first bipolar transistor 122 may be a BiFET or BiHEMT.

The source terminal of the second transistor 106 may be coupled with a second power cell 124 via a second line 126. The second power cell 124 may be indicated by the dashed line in FIG. 1. In embodiments, the second power cell 124 may include a plurality of power cell structures similar to those of the first power cell 114. Specifically, the second power cell 124 may include a second power cell structure 128 including a second resistor 130, a second capacitor 132, and a second bipolar transistor 134. The second power cell 124 may additionally include one or more other power cell structures such as third power cell structure 136. In some embodiments, the second power cell 124 may have up to fifteen power cell structures, as indicated by the dashed lines in FIG. 1 and fifteenth power cell structure 138. In some embodiments, the second bipolar transistor 134 may be a heterojunction bipolar transistor. In some embodiments, the second bipolar transistor 134 may be a BiFET or BiHEMT. In some embodiments, the first power cell 114 may have an increased number of power cell structures. In some embodiments, the second power cell 124 may have more or less than fifteen power cell structures.

In embodiments, the resistors of each of the power cell structures 128, 136 and 138 in the second power cell 124 may be coupled with the source terminal of the second transistor 106 via the second line 126. In embodiments, the emitters of each of the bipolar transistors in the second power cell 124, for example second bipolar transistor 134, may be coupled with one another and to ground via an emitter-ground line 140. As shown, the emitter of the first bipolar transistor 122 in the first power cell 114 may likewise be coupled with ground.

The collectors of each of the bipolar transistors in the second power cell 124, for example second bipolar transistor 134, may be coupled with one another and to the collector of the first bipolar transistor 122 in the first power cell 114 via the first collector line 142. Similarly, the capacitors of each power cell structure, for example first capacitor 120 of the first power cell 114 and second capacitor 132 of the second power cell 124, may be coupled with one another via a third power line 144.

The third power line 144 may be coupled with an RF input 146 configured to provide an input voltage or power to the RF PA 100. The first collector line 142 may be coupled with an operating power or voltage input 148 configured to provide an operating voltage to the RF PA 100. In embodiments, the operating power input 148 may be coupled with an inductor 150. In some embodiments, the first collector line may also be coupled with RF output power 152. In some embodiments, RF output power 152 may be coupled with a matching network (not shown).

The RF PA 100 depicted in FIG. 1 exhibits increased linearity over other existing RF PAs. Specifically, the use of both the first transistor 104 and the second transistor 106 may be considered to split the MOSFET, MESFET, PHEMT, BiFET or BiHEMT of an existing RF PA into two transistors. The device size of the first transistor 104 may be smaller than the second transistor 106. For example, in one embodiment the device size of the first transistor 104 may be on the order of 40 um$^2$, and the device size of the second transistor 106 may be on the order of 1200 um$^2$. The result of this difference may be that the first transistor 104 may be scaled to work at a relatively high current density, and the second transistor 106 may be scaled to work at a relatively low current density. Current density may be defined as the current pass through the transistor divided by the device size of that transistor.

In embodiments, scaling the first transistor 104 and the second transistor 106 to work at different current densities may involve selecting the ratio of the device size of the first transistor 104 and the second transistor 106, and the ratio of the power cell size of the first power cell 114 and the second power cell 124. If the ratio of the device size of the first transistor 104 and the second transistor 106 is different from the ratio of the power cell size of the first power cell 114 and the second power cell 124, then the first transistor 104 and the second transistor 106 may be said to work at different current densities.

Additionally, the RF power cells of existing RF PAs may be split into two parts, the first power cell 114 and the second power cell 124. As can be seen in FIG. 1, the first power cell 114 may be smaller than the second power cell 124. For example, the first power cell 114 may only contain a single power cell structure, while the second power cell 124 may contain a plurality of power cell structures. As noted, the second power cell 124 may contain as many as fifteen power cell structures in some embodiments, while in other embodiments the second power cell 124 may include more or less power cell structures.

In embodiments, the reference resistor 108 may serve to set a reference current to the collector of the bipolar transistor 110. Additionally, the feedback resistor 112 may sense a voltage change in the first line 116. The voltage of the first line 116 may be described as $V_{b1}$. The voltage of the second line 126 may be described as $V_{b2}$.

As can be seen in FIG. 1, the first power cell 114, the feedback resistor 112, bipolar transistor 110, and the first transistor 104 may form a PA with a closed loop bias circuit as a current mirror. In other words, the quiescent current of transistor 112 may be set by the reference current at the collector of transistor 110, which may be the same current pass through the resistor 108. By contrast, the second power cell 124, and the second transistor 106 may form a PA with an open loop bias circuit. In other words, the quiescent current of transistors in power cell 124 may not be directly set by the reference current at the collector of transistor 110. Instead, the quiescent current of transistors in power cell 124 may be set by the current passing through the transistor 106 directly. Because the respective gates of transistor 104 and transistor 106 may be coupled; the gate voltage of the transistor 106 may be the same voltage of the gate voltage of transistor 104, which may be set by the close loop current mirror bias described above. The source terminal voltage of the transistor 106 may be close to the base emitter junction voltage $V_{be}$ of the transistor in the power cell 124 (for example the transistor 134). Additionally, the base emitter junction voltage $V_{be}$ of the power cell 124 may be very close to the base emitter junction voltage $V_{be}$ of the transistor 122 in the power cell 114 because transistor 134 and transistor 122 may be the same type of bipolar transistor with the same process. Because the gate voltages of transistor 104 and transistor 106 may be the same, and the source voltages of transistor 104 and transistor 106 may be the same or very close, then the ratio of the current passing through the transistor 106 and the current passing through the transistor 104 may be closely proportional to the device size of the transistor 106 and the transistor 104 if the change of the source terminal voltage of the transistor 106 with current passing though it is not considered. The current density of the transistor 104 and transistor 106 may therefore be the same in this case.

However, the current passing through transistor 106 may cause a different source terminal voltage at transistor 106 as compared with transistor 104 when the size of transistor 104 transistor 106, and the size of power cell 124 and power cell 114 are scaled. In turn, the different source terminal voltage of transistor 106 may change the current passing though the transistor 106 as well as the current density of the transistor 106.

For example, if the device size ratio of transistor 104 and transistor 106 is approximately 1:30, the current passing through the transistor 106 may be approximately 30 times the current passing through transistor 104 because the source terminal voltage of transistor 104 and transistor 106 may be close to one another. Also, if the size of the power cell 124 is scaled to be approximately 15 times the size of power cell 114, then the current passing through the base of each transistor of power cell 124 may be about twice the current passing through the base of the transistor of power cell 114.

Additionally, there may be a base ballasting resistor of the same value at the base of each transistor, for example resistor 118 and resistor 130. So the voltage drop across the base ballasting resistor of power cell 124 may be about twice that of power cell 114. As described above, the base emitter junction voltage $V_{be}$ of the transistor of power cell 114 and power cell 124 may be the same due to the same process of the same type of transistors. The higher voltage drop on the base ballasting resistors of the power cell 124 may cause the source terminal voltage of the transistor 106 to be higher than that of transistor 104. The higher source terminal voltage may cause the actual current passing through the transistor 106 to be less than twice the current passing through the transistor 106, even though the size of the transistor 106 may still be twice the size of the transistor 104, as discussed above, when the gate voltage and the transistor type are the same.

Therefore, in this example, the transistor 106 may have a lower current density than the transistor 104. In other examples, different ratios of transistor 104 and transistor 106 may result in different current passing through the transistor 106 with different current density. In general, when the device size of transistor 104 and transistor 106 are scaled, and the device size of power cell 114 and power cell 124 are scaled, the current density of transistor 104 and transistor 106 may be controlled.

In operation, as the RF input signal provided by RF input 146 increases, the voltage of the first line 116 may drop. Generally the voltage of the second line 126 may have a tendency to also drop. The voltage drop of the first line 116 and the second line 126 may cause the bias points of the first power cell 114 and the second power cell 124 to drop with the increase of the input power at the RF input 146. However, when the voltage of the first line 116 drops, the current to the base of the bipolar transistor 110 may also drop. The drop in the current to the base of the bipolar transistor 110 may cause the current of the collector terminal of the bipolar transistor 110 to drop as well. As can be seen, the current at the collector terminal of the bipolar transistor 110 may be the same current that passes through the reference resistor 108, so the voltage drop across the reference resistor 108 may decrease.

As noted earlier, the power source 102 may provide a fixed reference voltage, $V_{DD}$. In embodiments, $V_{DD}$ may be considered to be generated externally to the RF PA 100. As noted above, an increase in the RF input signal provided by RF input 146 may result in a decreased voltage drop across reference resistor 108. Because $V_{DD}$ is a fixed voltage, the decrease of the voltage drop across the reference resistor 108 may result in a voltage increase at the gate terminals of the first transistor 104 and the second transistor 106.

As noted above, the first transistor 104 and second transistor 106 may be scaled to work at different current densities. Specifically, the first transistor 104 may be scaled to work at a higher current density while the second transistor 106 is scaled to work at a lower current density when the quiescent working point is selected. Because of the current density difference, the voltage across the gate terminal and the source terminal of the first transistor 104 may be greater than the voltage across the gate terminal and the source terminal of the second transistor 106. Because the gates of the first transistor 104 and second transistor 106 are electrically coupled, this voltage difference may pull the voltage of the second line 126 higher than the voltage of the first line 116. Pulling the voltage of the second line 126 higher than the voltage of the first line 116 may cancel the above described tendency for the voltage of the second line 126 to drop.

This increased voltage in the second line 126 may be controlled or scaled by properly adjusting the device size of the first transistor 104 or the second transistor 106. Similarly, adjusting the scale or size of components of the first power cell, for example first bipolar transistor 122, or the scale and/or size of components of the second power cell, for example second bipolar transistor 134, may likewise affect the increased voltage in the second line 126. Additionally, adjusting the ratio of the number of power cell structures in the first power cell 114 or the second power cell 124 may likewise affect the increased voltage in the second line 126. In embodiments, the first transistor 104, second transistor 106, first power cell 114, and/or second power cell 124 may be selected to provide a desired voltage change of the second line 126 with an RF input signal power increase from the RF input 146. In embodiments, providing the desired voltage change of the second line 126 may cause the voltage of the second line 126 to remain approximately the same regardless of an increase in RF input signal power from the RF input 146. In other embodiments, providing the desired voltage change of the second line 126 may cause the voltage of the second line 126 to increase as the RF input signal power from the RF input 146 increases, which may be called "bias boosting." As described below with respect to FIGS. 4 and 5, the desired voltage change of the second line 126 may occur when the voltage of the second line 126 increases slightly as the RF input signal power increases from the RF input 146.

As used herein, signal power or power may refer to a measurement in units of watts, milliwatts, dBm or some other power measurement. Changes to signal power may refer to changes in milliwatts or some other unit. In other embodiments, changes to signal power may refer to changes in voltage and/or current.

In general, it may be seen that the second line 126 may provide the bias current for the second power cell 124, which may be significantly larger than the first power cell 114 as described above. Because the second power cell 124 may be significantly larger than the first power cell 114, the second power cell 124 may amplify the majority of the RF input signal for the RF PA 100. Therefore, even though the voltage of the first line 116 may decrease as the RF input signal power increases, the overall linearity of the RF PA 100 may improve due to bias boosting effect on the second line 126.

Figure 2:
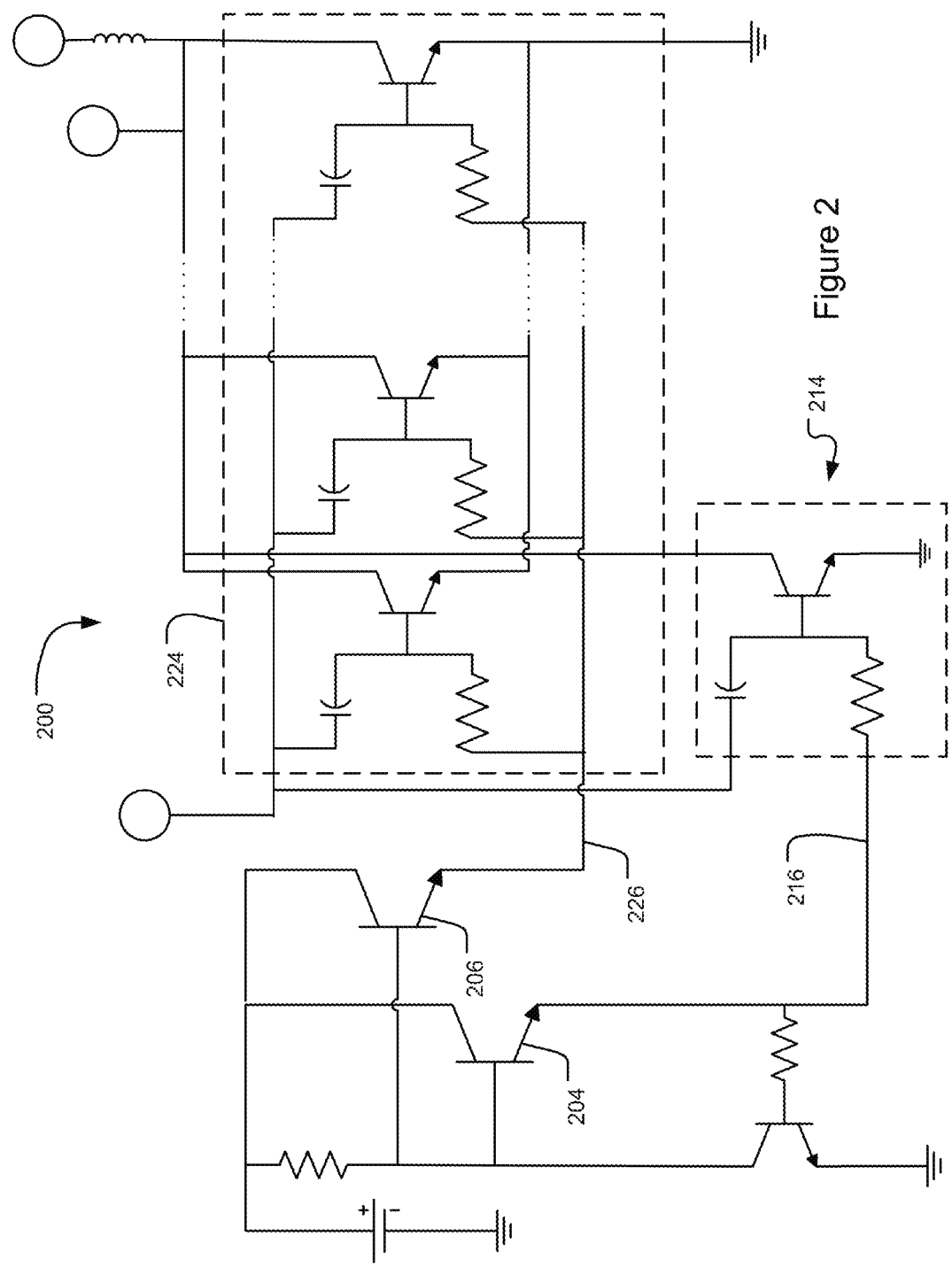
FIG. 2 schematically illustrates a circuit diagram of an RF PA, according to various embodiments.

FIG. 2 depicts an RF PA 200 which may be similar to the RF PA 100 of FIG. 1. The primary difference between the RF PA 100 of FIG. 1 and the RF PA 200 of FIG. 2 may be that the first transistor 204 may be a bipolar transistor rather than a MESFET type transistor. Similarly, the second transistor 206 of the RF PA 200 of FIG. 2 may be a bipolar transistor. In other embodiments, a first transistor of an RF PA, for example first transistors 104 or 204, may be a MESFET type transistor while the second transistor of the RF PA, for example second transistors 106 or 206, may be a bipolar type transistor (or vice versa). In other embodiments, one or both of the first transistor and second transistor of an RF PA may be a metal-oxide-semiconductor field-effect transistor (MOSFET) or some other type of field effect transistor (FET) or some other type of bipolar transistor.

As shown in FIG. 2, the emitter terminal of the first transistor 204 may be coupled with a first line 216, which in turn may be coupled with a first power cell 214. Similarly, the emitter terminal of the second transistor 206 may be coupled with a second line 226, which may in turn be coupled with a second power cell 224.

Figure 9:
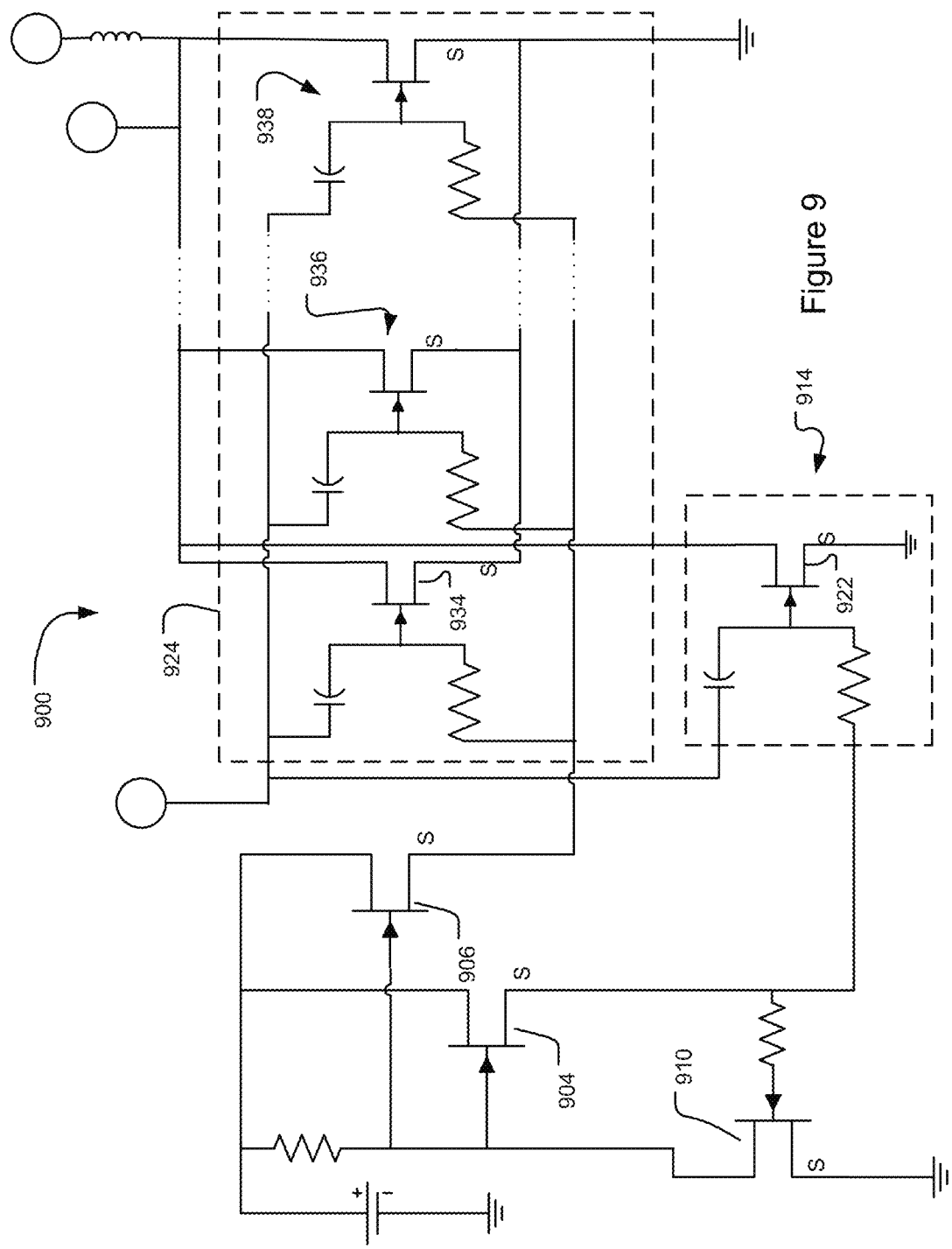
FIG. 9 schematically illustrates a circuit diagram of an RF PA, according to various embodiments.

FIG. 9 depicts an RF PA 900 which may be similar to the RF PA 100 of FIG. 1 or the RF PA 200 of FIG. 2. However, in RF PA 900, the transistors of the first power cell 914 and the second power cell 924 may not be bipolar transistors, but may be a different type of transistor such as a MOSFET, MESFET, PHEMT, or some other type of transistor. Specifically, the first transistor 922 and the second transistor 934 may be non-bipolar transistors and may instead be a MOSFET, MESFET, or PHEMT. Similarly, the transistors of the third power cell structure 936 through the fifteenth power cell structure 938 may not be bipolar transistors. As shown in FIG. 9, the first transistor 904, the second transistor 906 and reference transistor 910 may not be bipolar transistors, but may be a different type of transistor such as a MOSFET, MESFET, PHEMT, or some other type of transistor.

It will be understood that the RF PAs 100, 200, and 900 are examples of different embodiments, and in other embodiments different transistors may be bipolar or non-bipolar transistors. For example, in some embodiments, the transistors of the first and second power cells may be bipolar transistors while the first and second transistors are non-bipolar transistors. In some embodiments the reference transistor may be bipolar, for example bipolar transistor 110, or non-bipolar, for example reference transistor 910.

Figure 3:
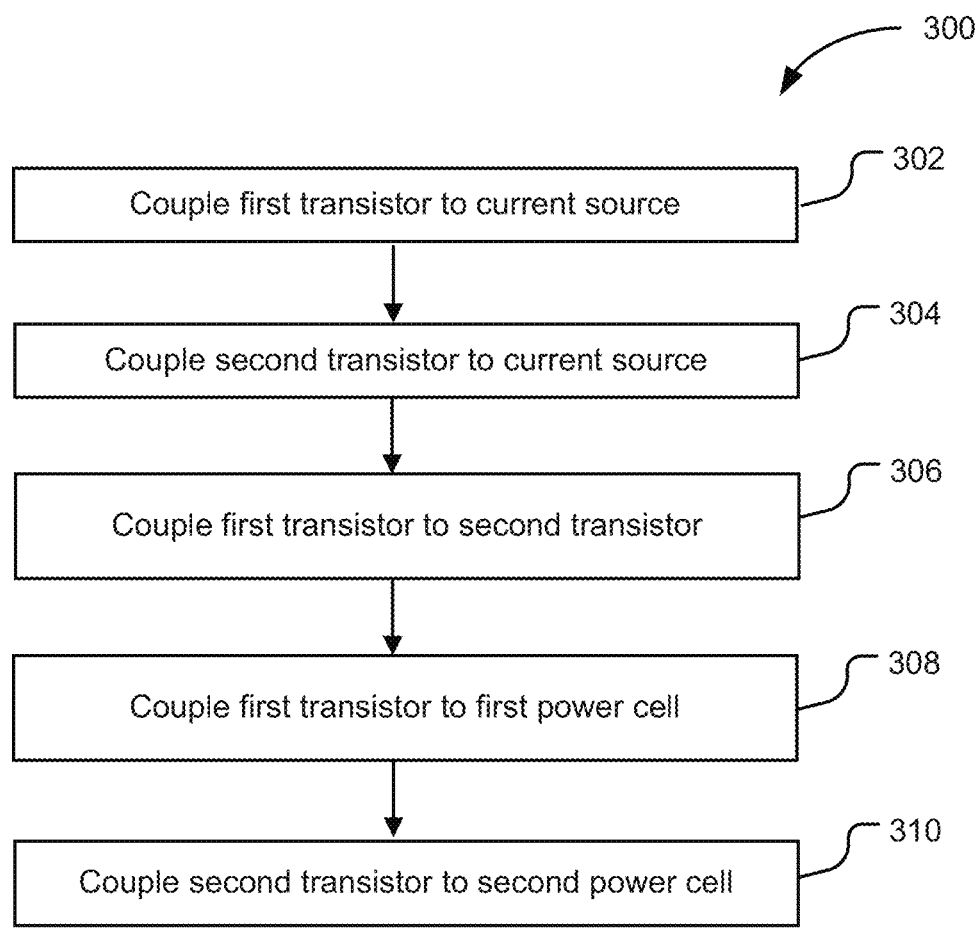
FIG. 3 illustrates a process of constructing an RF PA, according to various embodiments.

FIG. 3 depicts an example process 300 for constructing an RF PA such as RF PAs 100, 200, or 900. In embodiments, a first transistor, for example first transistor 104, 204, or 904, may be coupled with a current/voltage source, for example power source 102, 202, or 902 at 302. A second transistor, for example second transistor 106, 206, or 906, may then be coupled with the current/voltage source at 304. The first transistor may then be coupled with the second transistor at 306. For example, as shown in FIG. 1, 2, or 9, the gates or base of the first transistor and second transistor may be coupled with one another. Alternatively, the collector terminals and/or drain terminals may be coupled with one another.

The first transistor may then be coupled with a first power cell, for example first power cell 114, 214, or 914, at 308. Similarly, the second transistor may be coupled with a second power cell, for example second power cell 124, 224, or 924 at 310.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Figure 4:
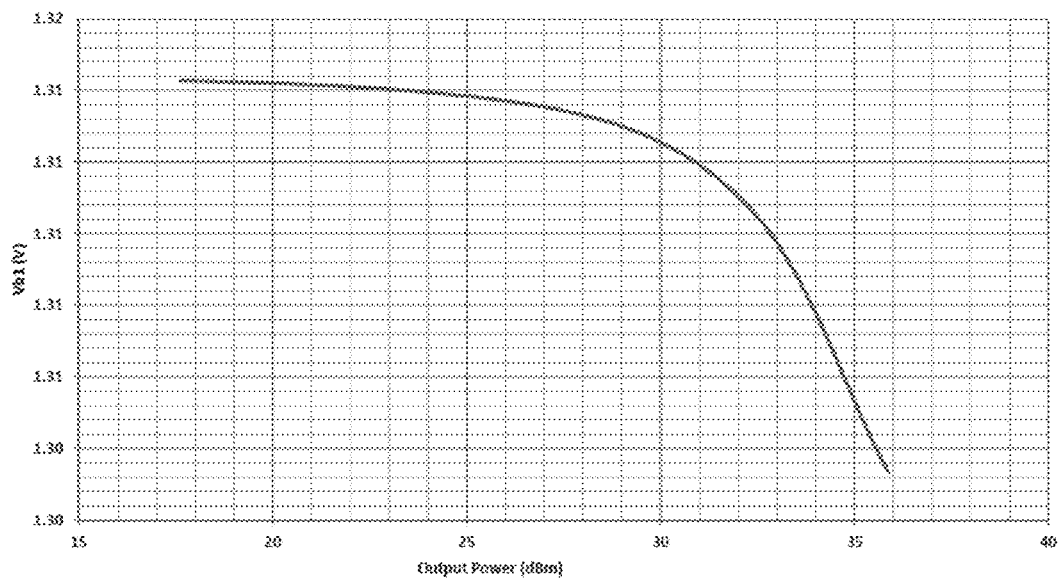
FIG. 4 is a simulated result of a first voltage compared against output power in an RF PA, according to various embodiments.
Figure 5:
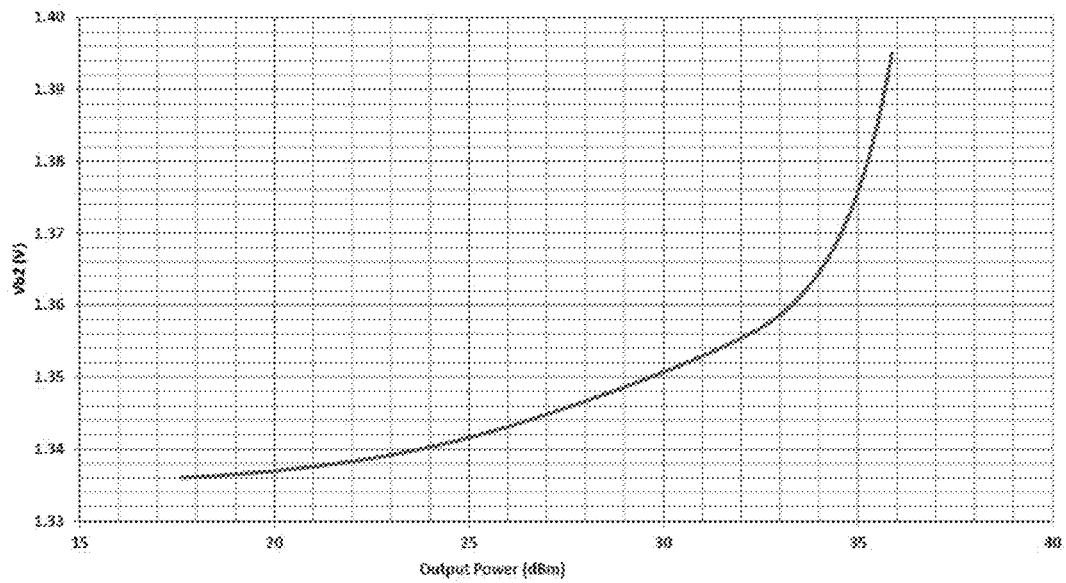
FIG. 5 is a simulated result of a second voltage compared against output power in an RF PA, according to various embodiments.

FIGS. 4 and 5 depict a simulated result of increasing the RF output signal power due to increased RF input signal power for an RF PA such as RF PA 100. Specifically, FIG. 4 depicts a simulated voltage at the first line 116 as the RF output signal power is increased, for example by increasing the RF input signal power at the RF input 146 and amplifying it using the RF PA 100. By contrast, FIG. 5 depicts a simulated voltage at the second line 126 as the RF output signal power is increased. As can be seen in FIG. 4, the voltage of the first line may stay relatively level until an output signal power between 25 and 30 dBm (sometimes referred to as dBmW), at which point the voltage of the first line may start to decrease significantly. By contrast, as can be seen in FIG. 5, the voltage of the second line may increase slightly as the output signal power increases until the output signal power reaches roughly 33 dBm, at which point the voltage of the second line may increase significantly. These inflection points where the voltages of the first or second lines begin to change more dramatically may be based on one or more of the particular values or scales associated with the first transistor 104, the second transistor 106, the first power cell 114, and/or the second power cell 124. It may also be seen in FIG. 5 that the voltage of the second line may increase slightly as the output signal power increases until the output signal power reaches an inflection point at roughly 33 dBm. This increase in the voltage of the second line may be based on the bias boosting effect described above with respect to FIG. 1. As noted, the simulated results of FIGS. 4 and 5 are merely examples, and in other embodiments the values used may be different due to a difference in one or more of the first transistor 104, the second transistor 106, the first power cell 114, and/or the second power cell 124.

Figure 6:
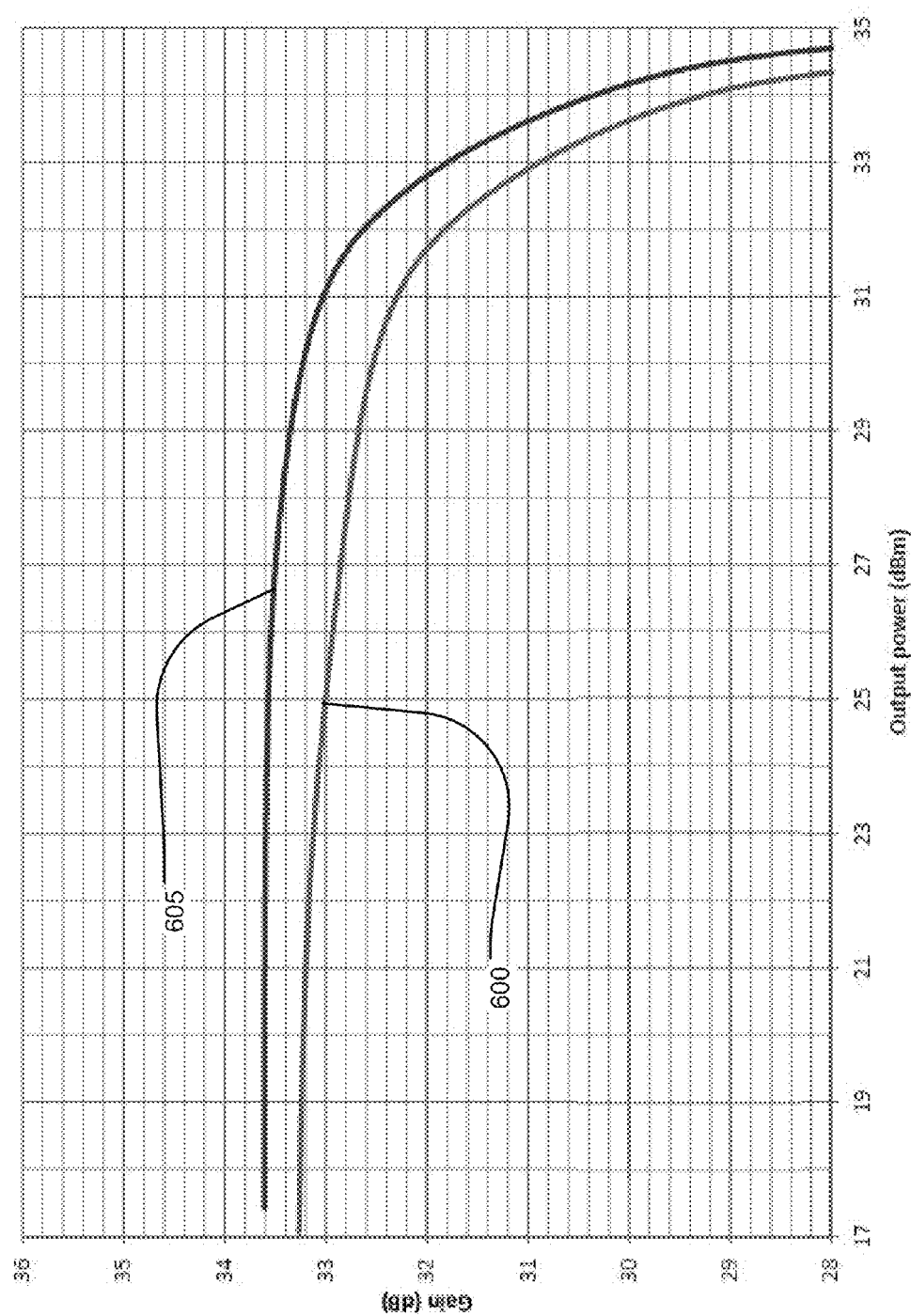
FIG. 6 is a simulated result of gain compared against output power for two different circuits, according to various embodiments.

FIG. 6 may depict a simulated result of increasing RF output signal power in an RF PA. Specifically, FIG. 6 may depict a simulated comparison of signal gain in an RF PA against output signal power for an existing circuit and an RF PA such as RF PA 100. The first line 600 may depict output signal gain of an existing RF PA compared against output signal power in dBm of the existing RF PA. By contrast, the second line 605 may depict output signal gain of an RF PA such as RF PA 100 compared against output signal power in dBm of an RF PA such as RF PA 100. In FIG. 6, an existing RF PA may have a relatively linear signal gain when output signal power is between from 17 dBm through 21 dBm, at which point the existing RF PA may start to exhibit non-linear characteristics. Specifically, after an output signal power of approximately 21 dBm, the signal gain may vary as the output signal power increases. The non-linear signal gain characteristics may increase as output signal power increases to approximately 31 dBm, at which point the RF PA may exhibit significant non-linear signal gain characteristics. That is, the signal gain may vary significantly as the output signal power increases.

By contrast, the RF PA of the present disclosure, for example RF PA 100, may exhibit strong linear gain characteristics as output signal power increases from 17 dBm through 25 dBm, that is the signal gain at a first output signal power may be approximately similar to the signal gain at another output signal power. As the output signal power reaches and passes approximately 25 dBm, the RF PA such as RF PA 100 may start to exhibit slight non-linear signal gain characteristics. Therefore, as can be seen in FIG. 6, the RF PA of the present disclosure may exhibit significantly increased linear characteristics.

Figure 7:
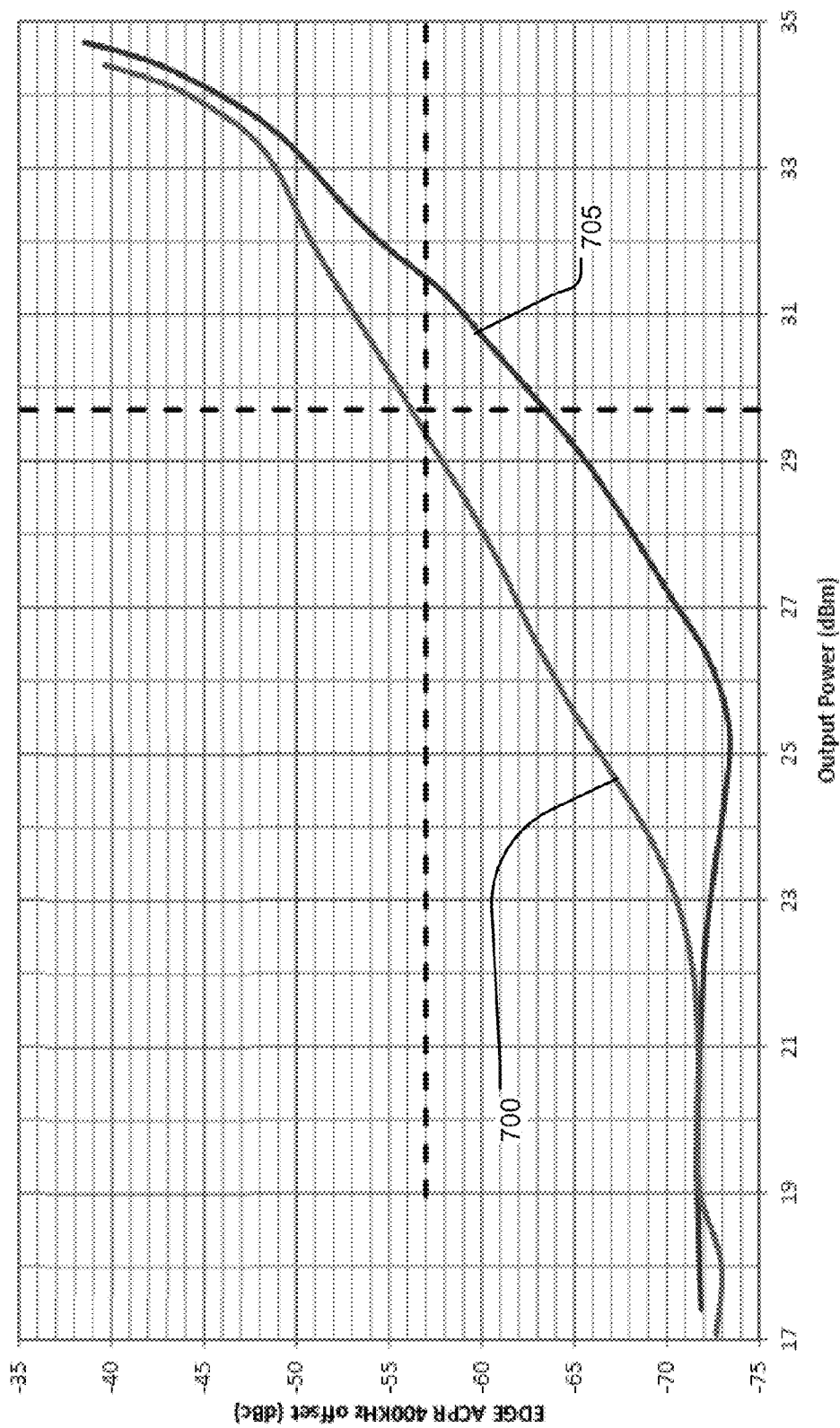
FIG. 7 is a simulated result of adjacent channel power ratio (ACPR) compared against output power for two different circuits, according to various embodiments.
Figure 10:
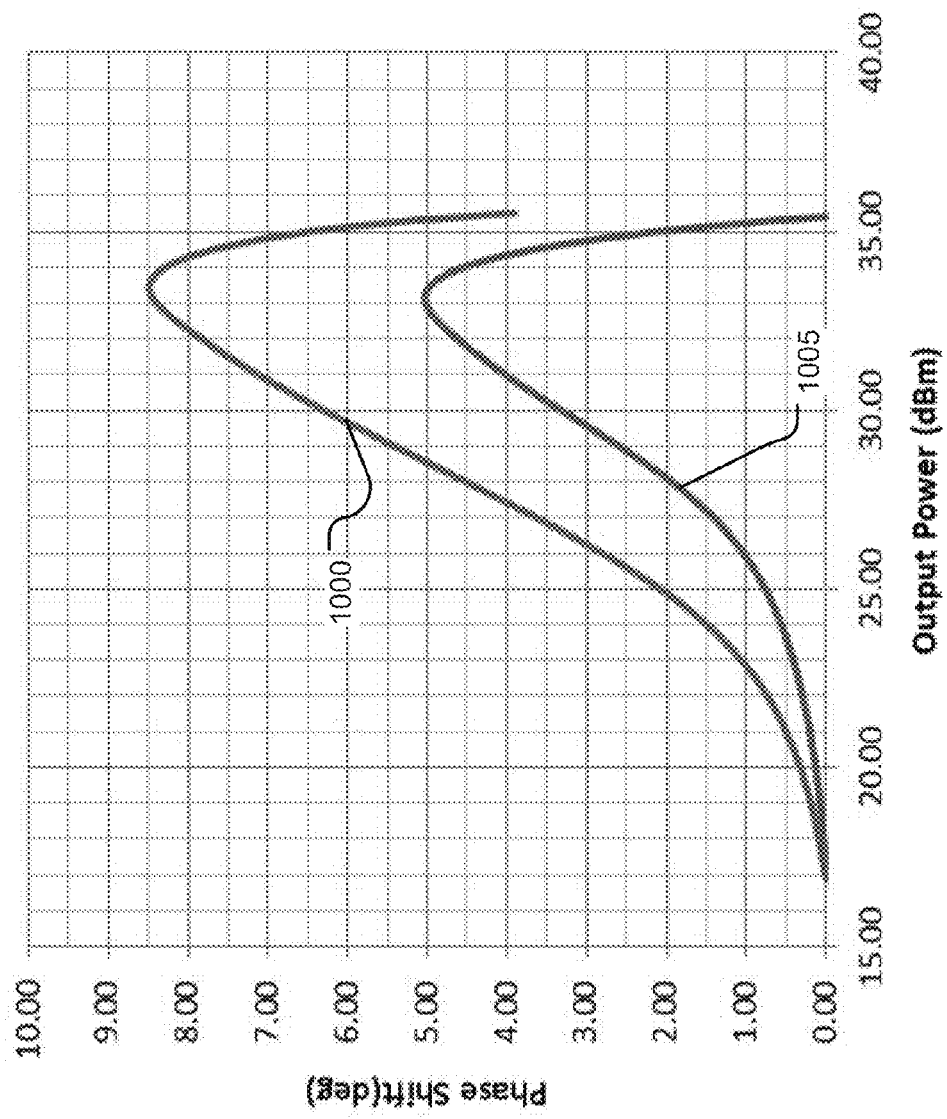
FIG. 10 is a simulated result of phase shift compared against output power for two different circuits, according to various embodiments.

FIG. 10 may depict a simulated result of increasing RF output signal power in an RF PA according to the present disclosure. Specifically, FIG. 10 may depict a simulated comparison of signal phase shift in an RF PA against output signal power for an existing circuit, line 1000 and an RF PA such as RF PA 100, 200, or 900, line 1005. As shown in FIG. 10, the phase of an RF PA according to the present disclosure, line 1005, may be significantly smaller than that of an existing RF PA as shown at line 1000 FIG. 7 depicts a simulated comparison of ACPR of an existing circuit and an RF PA such as RF PA 100 to output signal power of the respective circuits. Specifically, the first line 700 may represent the ACPR of an existing circuit compared to the output signal power of that circuit. The second line 705 may represent the ACPR of an RF PA such as RF PA 100 to the output signal power of the RF PA. In embodiments, it may be desirable for ACPR to remain low as output signal power increases. Particularly, for example in EDGE communicate standard, it may be desirable for the ACPR to remain generally below −57 dBc (represented by the horizontal dashed line in FIG. 7) as output signal power increases up to an output power of the PA of between 29 and 30 dBm (represented by the vertical dashed line in FIG. 7). This relatively low ACPR may be desirable because the low ACPR may result in less interference to the user at adjacent channel. As can be seen in FIG. 7, the ACPR of an existing circuit may be above the desired ACPR at an output signal power of between 29 and 30 dBm. By contrast, the ACPR of the RF PA such as RF PA 100 may remain below the ACPR threshold of −57 dBc until the output signal power of the RF PA reaches approximately 31.5 dBm. It will be understood that these examples are simulated results for one embodiment of an RF PA such as RF PA 100 and an existing RF PA. In other embodiments the different ACPR slopes or intercepts of lines 700 or 705 may be different. Additionally, the threshold values of approximately −57 dBc for ACPR and 29.7 dBm for output power may be different in other embodiments.

Figure 8:
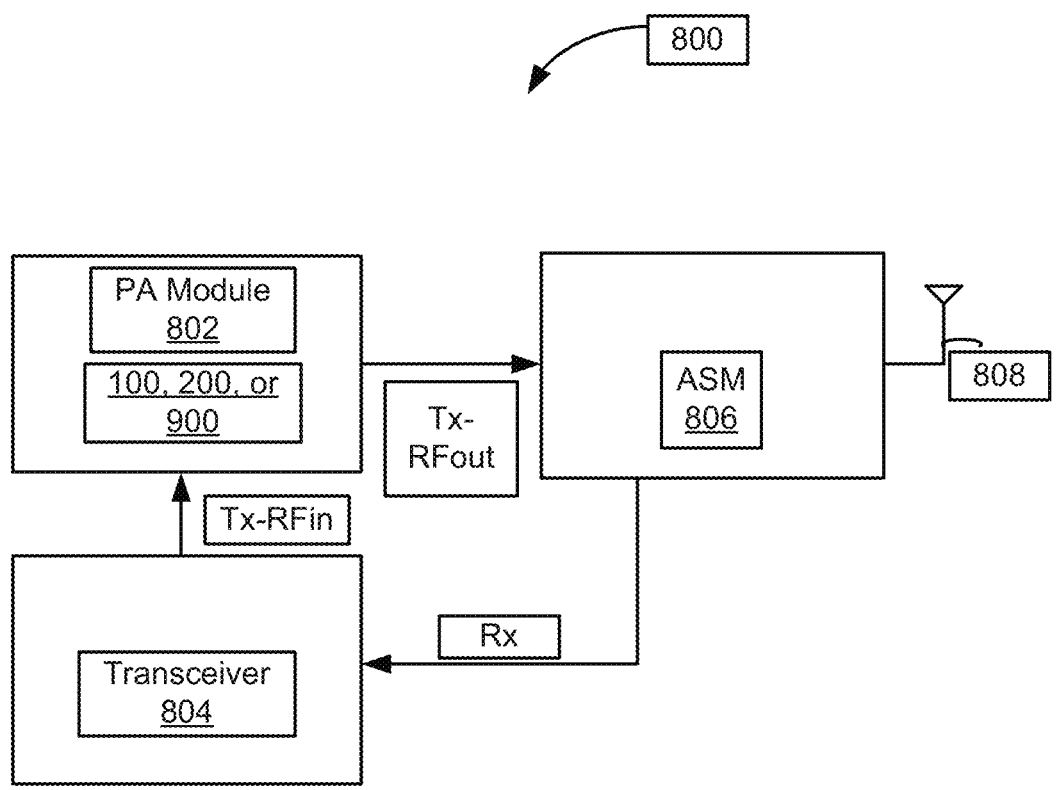
FIG. 8 schematically illustrates an example system including an RF PA, according to various embodiments.

Embodiments of an RF PA (e.g., the RF PAs 100 or 200) described herein, and apparatuses including such RF PA may be incorporated into various other apparatuses and systems. A block diagram of an example system 800 is illustrated in FIG. 8. As illustrated, the system 800 includes a PA module 802, which may be an RF PA module in some embodiments. The system 800 may include a transceiver 804 coupled with the PA module 802 as illustrated. The PA module 802 may include one or more RF PAs (e.g., the RF PAs 100 or 200) described herein.

The PA module 802 may receive an RF input signal, RFin, from the transceiver 804. The PA module 802 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 8.

The amplified RF output signal, RFout, may be provided to an antenna switch module (ASM) 806, which effectuates an over-the-air (OTA) transmission of the RF output signal, RFout, via an antenna structure 808. The ASM 806 may also receive RF signals via the antenna structure 808 and couple the received RF signals, Rx, to the transceiver 804 along a receive chain.

In various embodiments, the antenna structure 808 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 800 may be any system including power amplification. The RF PA (e.g., RF PAs 100 or 200) may provide an effective switch device for power-switch applications, which may include power conditioning applications, such as, for example, Alternating Current (AC)-Direct Current (DC) converters, DC-DC converters, DC-AC converters, and the like. In various embodiments, the system 800 may be particularly useful for power amplification at high radio frequency power and frequency. For example, the system 800 may be suitable for any one or more of terrestrial and satellite communications, radar systems, and possibly in various industrial and medical applications. More specifically, in various embodiments, the system 800 may be a selected one of a radar device, a satellite communication device, a mobile handset, a cellular telephone base station, a broadcast radio, or a television amplifier system.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A power amplifier comprising:
a first transistor scaled to operate at a first current density;
a second transistor scaled to operate at a second current density, the first transistor coupled with the second transistor;
a first power cell comprising a third transistor coupled with the first transistor, the first transistor configured to bias the first power cell; and
a second power cell comprising a plurality of transistors coupled with the second transistor, the second transistor configured to bias the second power cell;
wherein the third transistor includes a first collector, and individual transistors in the plurality of transistors include respective collectors, and the first collector is coupled with the respective collectors.

2. The power amplifier of claim 1, wherein the first transistor is a bipolar transistor.

3. The power amplifier of claim 2, wherein the first transistor includes a first base; and
wherein the second transistor is a bipolar transistor that includes a second base coupled with the first base.

4. The power amplifier of claim 1, wherein the first transistor is a field-effect transistor.

5. The power amplifier of claim 4, wherein the first transistor includes a first gate; and wherein the second transistor is a field-effect transistor that includes a second gate coupled with the first gate.

6. The power amplifier of claim 1, wherein the plurality of transistors comprise fifteen transistors.

7. A method comprising:

coupling an input of a first transistor to a power source, the first transistor scaled based on a first current density;

coupling an input of a second transistor to the power source, the second transistor scaled based on a second current;

coupling a first terminal of the first transistor with a first terminal of the second transistor;

coupling an input of a first power cell including a third transistor with a second terminal of the first transistor; and coupling an input of a second power cell including a plurality of transistors with a second terminal of the second transistor;

wherein the third transistor includes a first collector, and each transistor in the plurality of transistors respectively include respective collectors, and further comprising coupling the first collector with the respective collectors.

8. The method of claim 7, wherein the first transistor is a bipolar transistor.

9. The method of claim 8, wherein the input of the first transistor is a first base;

wherein the second transistor is a bipolar transistor; and wherein the input of the second transistor is a second base.

10. The method of claim 7, wherein the first transistor is a field-effect transistor.

11. The method of claim 10, wherein the input of the first transistor is a first gate;

wherein the second transistor is a field-effect transistor; and wherein the input of the second transistor is a second gate.

12. The method of claim 7, wherein the plurality of transistors comprise fifteen transistors.

13. A system comprising:

a power source; and a power amplifier coupled with the power source, wherein the power amplifier includes:

a first transistor scaled to operate at a first current density, the first transistor coupled with the power source;

a second transistor scaled to operate at a second current, the first transistor coupled with the power source;

a first power cell comprising a third transistor coupled with the first transistor; and a second power cell comprising a plurality of transistors coupled with the second transistor;

wherein the third transistor includes a first collector, and each transistor in the plurality of transistors respectively include respective collectors, and the first collector is coupled with the respective collectors.

14. The system of claim 13, wherein the first transistor is a bipolar transistor.

15. The system of claim 14, wherein the first transistor includes a first base and wherein the second transistor is a bipolar transistor that includes a second base coupled with the first base.

16. The system of claim 13, wherein the first transistor is a field-effect transistor.

17. The system of claim 16, wherein the first transistor includes a first gate and wherein the second transistor is a field-effect transistor that includes a second gate coupled with the first gate.

18. The system of claim 13, wherein the plurality of transistors comprise fifteen transistors.

19. The system of claim 13, further comprising a transceiver coupled with the power amplifier.

* * * * *